United States Patent [19]

Lee

[11] 4,356,252
[45] Oct. 26, 1982

[54] PHOTOSENSITIVE NEGATIVE-WORKING TONABLE ELEMENT

[75] Inventor: Ross A. Lee, Webster, N.Y.

[73] Assignee: E. I. Du Pont de Nemours and Company, Wilmington, Del.

[21] Appl. No.: 259,956

[22] Filed: May 4, 1981

Related U.S. Application Data

[62] Division of Ser. No. 106,401, Dec. 26, 1979, Pat. No. 4,294,909.

[51] Int. Cl.$^3$ .............................................. G03C 5/04
[52] U.S. Cl. .................................. 430/270; 430/291; 430/326; 430/908; 430/909; 430/910; 430/911; 430/912; 430/926
[58] Field of Search ............... 430/270, 291, 292, 324, 430/326, 144, 908, 909–912, 926

[56] References Cited

U.S. PATENT DOCUMENTS

| | | | |
|---|---|---|---|
| 3,649,268 | 3/1972 | Chu et al. | 96/27 R |
| 3,754,912 | 8/1973 | Jones et al. | 96/36 |
| 3,779,778 | 12/1973 | Smith et al. | 96/115 R |
| 3,984,253 | 10/1976 | Nelson | 96/115 R |
| 4,053,313 | 10/1977 | Fan | 96/36 |
| 4,101,323 | 7/1978 | Buhr et al. | 430/270 |
| 4,247,611 | 1/1981 | Sander et al. | 430/286 |

FOREIGN PATENT DOCUMENTS 2342068  4/1974  Fed. Rep. of Germany .

Primary Examiner—Mary F. Downey

[57] ABSTRACT

A photosensitive element which comprises a support bearing a layer of negative-working tonable photoimaging composition comprising at least one organic polymeric binder (a), a photosensitizer (b) which generates an acid upon absorption of actinic radiation, and at least one compound taken from the group of

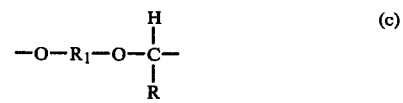 (c)

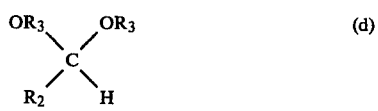

(d)

as defined, binder (a) being plasticized by the decomposition product of either compound (c) or (d) or the combination thereof. The photosensitive element is useful in making color proofs.

6 Claims, No Drawings

PHOTOSENSITIVE NEGATIVE-WORKING TONABLE ELEMENT

This is a division of application Ser. No. 106,401 filed Dec. 26, 1979 now U.S. Pat. No. 4,294,909.

DESCRIPTION

1. Technical Field

This invention relates to new photosensitive elements, and more particularly to negative-working tonable photosensitive elements.

2. Background Art

Photosensitive elements are known as reproduction means in many areas of photographic reproduction. One such means is the differences in adhesive properties between the imagewise exposed and unexposed image areas.

Reproduction processes are known from U.S. Pat. Nos. 3,060,024, 3,582,327 and 3,649,268 wherein photopolymerizable elements comprising a base support bearing a photopolymerizable layer which comprises at least one addition polymerizable monomeric compound and a photopolymerization initiator are exposed imagewise through an original forming nontacky image areas in the exposed image areas. The image is made visible (developed) by dusting with a suitable toner which adheres only to the unexposed tacky areas. Excess toner is then removed from the exposed, nontacky image areas.

By the aforementioned process, positive colored images of the original are obtained which are equivalent of press proofs. While positive images are achieved by the above process, it has not been possible to prepare by a simple method using a single layer element negative images with respect to the original. Such a need for reproduction of negative images exists in many applications, e.g., direct color separation technology.

An object of this invention is to provide an element having a single photosensitive layer for preparing negative tonable images.

DISCLOSURE OF INVENTION

In accordance with this invention there is provided a photosensitive element comprising a support bearing a layer of a negative-working tonable photoimaging composition which comprises
(a) at least one organic polymeric binder taken from the group consisting of polyvinylformal, polyvinylpyrrolidone, polyacrylate, cellulose acetate polymethacrylate, and polyvinyl acetate;
(b) a photosensitizer which upon absorption of actinic radiation is capable of generating an acid; and at least one acetal compound taken from the group of

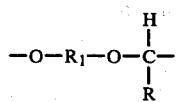
(c)

wherein R is hydrogen, alkyl of 1 to 18 carbon atoms, phenyl and substituted phenyl, and $R_1$ is taken from the group of alkylene of 2 to 12 carbon atoms and heteroalkylene of 2 to 12 carbon atoms, and

(d)

wherein $R_2$ is alkyl of 1 to 18 carbon atoms, furyl, substituted furyl, phenyl, substituted phenyl, naphthyl and substituted naphthyl, $R_3$ is alkyl of 1 to 18 carbon atoms, and $OR_3$ when taken together form a 5, 6, or 7 membered ring,
the polymeric binder (a) being plasticized by the decomposition product of one of compound (c), compound (d) or the combination of compounds (c) and (d).

The negative-working tonable photoimaging composition comprises
(a) at least one organic polymer binder,
(b) a photosensitizer which generates an acid upon absorption of the actinic radiation used to expose a layer of the composition,
(c) a polymeric acetal as defined above, and/or
(d) a monomeric acetal as defined above.

The binder component is plasticized by the decomposition product of a compound (c), a compound (d) or the combination thereof, as the case may be. An additional plasticizer (e) as described below, may be present in the photoimaging composition. After imagewise exposure the tacky, plasticized exposed image areas retain toner applied thereto.

Useful binder/acetal combinations which produce negative-working tonable photoimaging compositions upon imagewise exposure to actinic radiation can be determined according to the following procedure. A particular organic polymeric binder is selected and is tested for tackiness with the alcohol or glycol and aldehyde reactants (and expected hydrolysis products) for a particular acetal compound, e.g., polymeric or monomeric. By way of illustration, in Example 2 below, polyvinylformal binder becomes sticky, i.e., is plasticized, on treatment with either benzaldehyde or 1,3-propanediol. These are the reactants, and predicted acid catalyzed hydrolysis products, for 2-phenyl-1,3-dioxane acetal. Following the determination of tackiness achieved with a given binder, the useful alcohol or glycol and aldehydes tested can be made into an acetal or polyacetal such as disclosed herein.

Useful organic polymeric binders are taken from the group consisting of polyvinylformal, cellulose acetate polyvinylpyrrolidone, polyacrylate, polymethacrylate, polyvinyl acetate and mixtures thereof. Polyvinylformal is the preferred binder. Useful acetals include polyacetals (c) and monomeric acetals (d). Mixtures of these acetals can also be used.

Useful polyacetals (c) are: polyacetals of formaldehyde and 1,5-pentanediol, benzaldehyde and 1,5-pentanediol, butyraldehyde and 2,2'-oxydiethanol, butyraldehyde and triethylene glycol, furfural and 2-ethylhexane-1,6-diol, anisaldehyde and 1,5-pentanediol, benzaldehyde and 1,8-octanediol, octadecanal and 1,5-pentanediol, etc. Useful acetals (d) are: 2-phenyl-1,3-dioxane, 2-phenyl-1,3-dioxolane, α,α-dimethoxytoluene, 2-butyl-1,3-dioxolane, α,α-bis(2-butoxyethyloxy) toluene, 2-naphthyl-1,3-dioxolane, 1,1-dimethoxybutane 1,1-dibutoxyheptane, 2-(p-methoxyphenyl)-1,3-dioxane, 2-(dimethoxymethyl)-furan, 1,1-dibutoxyoctadecane, etc.

The negative-working tonable photoimaging composition also contains a photosensitizer compound (b) which upon exposure to actinic radiation absorbs the radiation to generate an acid. The acid formed attacks the polyacetal(s) present to form decomposition product(s) which in turn plasticize the polymeric binder. Photosensitizer compounds (b) include: 2-tribromomethylquinoxaline, carbon tetrabromide, N-chloro-2-azacyclononanone, 2-tribromomethylquinoline, 2,2,3,4-tetrachloronaphth-3-en-1-one, tris-trichloromethyl-s-triazine, tris-tribromomethyl-s-triazine.

Based on the total weight percent of total solids of the photoimaging composition there are present binder (a) 20 to 80%, photosensitizer (b) 3 to 25%, polyacetal (c) 20 to 60%, acetal (d) 20 to 60% with a combined weight of acetals (c) and (d) of 20 to 60%.

Preferably the components are present in the composition as follows:

binder (a) 30 to 66%, photosensitizer (b) 5 to 15%, polyacetal (c) 25 to 35% (single component), 13 to 25% [in combination with acetal (d)] and acetal (d) 45 to 55% (single component) 20 to 30% [in combination with polyacetal (c)].

The above concentration ranges are governed by the degree of tackiness of the photoimaging layer and the compatability of the components of the composition to form a clear layer. Tack-free nonexposed image areas are desirable to prevent undesired background toning. It is important to note that the component percentages vary depending on the particular combination of components used.

It is preferred that an additional plasticizer (e) for the photosensitive composition be present in the photosensitive composition. Useful plasticizers include: glycol esters or glycol ethers, e.g., triethylene glycol diacetate, ethylene glycol dibutyrate, etc.; phthalic acid ester, e.g., dioctylphthalate, etc.; phosphoric acid ester, e.g., tricresylphosphate, trioctylphosphate, etc.; esters of aliphatic dicarbonic acids, e.g., esters of adipic acid such as dibutyladipate, etc. The amount of plasticizer present is related to the particular binder used and should be apportioned so that the unexposed layer is not adhesive or tacky. The change in adhesiveness produced by the imagewise exposure is sufficient to produce a total adhesiveness which retains the applied toner. The plasticizer can be present in amounts of 0 to 20% by weight based on the total dry weight of the photosensitive composition.

It has been found desirable to have present in the photosensitive composition up to 10% by weight based on the the total weight of solids of a polymeric anhydride. It is believed that the anhydride reacts with released glycol containing plasticizer when such a plasticizer is used. This is particularly important when a multicolored image is prepared by laminating of singly toned layers. Migration of the plasticizer into the newly laminated layer is thereby prevented.

In addition to the above-mentioned components, the photosensitive composition can optionally contain additional additives in amounts known to those skilled in the art, e.g., stabilizers, optical brighteners, delustering agents, auxiliary coating agents, etc.

The photosensitive composition is applied to the base support. Useful transparent or opaque support materials include: paper, optionally treated with barite; cardboard; metal sheets, e.g., aluminum, copper, steel, etc.; wood; glass; films or fiber webs of natural or synthetic polymers, e.g., polyamides, rubber, polyethylene or polypropylene, linear polyesters, e.g., polyethylene terephthalate; cellulose, cellulose esters, polyvinyl chloride or their copolymers, polyacrylonitrile, etc.

A special protective film present over the photosensitive layer which must be removed before the development procedure is basically not necessary. It can, however, if desired, be present to prevent damage to the photosensitive coating. If necessary, it is also possible to apply additional nonphotosensitive coatings to the support, for example, an antihalation coating.

The components of the photosensitive layer are generally applied as a solution in volatile solvents according to well-known methods and subsequently dried. Suitable solvents are, for example, methylene chloride, tetrahydrofuran, acetic acid ethylester, acetone, etc. Other application means without the use of solvents such as calendering, extruding or the like are also useful.

The concentration of the nonvolatile components of the coating solution can fluctuate within broad limits but is dependent on the coating method and the layer or thickness desired for the different purposes of application.

To tone the imagewise exposed photosensitive layer, powdered dyes and/or pigments of many different types can be used. For example, inorganic or organic pigments are suitable as are soluble organic dyes. The individual dye particles can be provided with a protective layer of a suitable polymeric material for the purpose of improving handling. Suitable toners are described, for example, in U.S. Pat. Nos. 3,060,024, 3,620,726, and 3,909,282.

The toning procedure is either implemented manually, e.g., by means of a cotton pad, or a special application device. Generally the element is slightly heated, e.g., up to 100° C. while toning. The image can, in this case, be produced directly on the support, which carries the exposed photosensitive layer. If desired, the toned image can be transferred also to another material by lamination. According to another embodiment, the photosensitive layer is transferred to the final support prior to the exposure and there exposed and toned. Depending on the selection of support material nontransparent as well as transparent images can be produced. For the production of multicolored images several images toned in the individual colors are coated or laminated over each other. Multicolor images can be formed on a single photosensitive layer by exposing the layer through separation transparencies and then toning the tacky exposed image areas. Prior to a subsequent exposure the toned layer is buffed or rubbed until the toner in the exposed image areas is glossy.

Exposure of the photosensitive layer is accomplished by using ultraviolet radiation furnishing sources. These sources include: carbon arcs, mercury-vapor arcs, fluorescent lamps with special ultraviolet-emitting phosphors, argon glow lamps, electronic flash units and photographic flood lamps. The amount of exposure required for satisfactory reproduction of a given photosensitive layer is a function of exposure time, type of radiation source used, and distance between the radiation source and layer surface. In general, exposure times range from about 60 seconds to 10 minutes or more using standard commercial radiation sources.

BEST MODE FOR CARRYING OUT THE INVENTION

The best mode is illustrated in Example 1 wherein a mixture of acetal compounds, i.e., polyacetal and non-polymeric acetal, is present in combination with polyvinylformal binder and 2-tribromomethylquinoxaline photosensitizer to form a negative-working tonable photoimaging composition.

INDUSTRIAL APPLICABILITY

The photosensitive elements are useful for the reproduction of negative images in many applications, e.g., direct color separation technology, single and multicolor images from masters, etc. The system has add-on capability and can be used in single layer form to record images of different colors, e.g., map proofing. In adding on a single layer, the exposed and toned areas are buffed or rubbed until glossy prior to subsequent exposing and toning.

EXAMPLES

The following examples illustrate the invention wherein the parts and percentages are by weight.

EXAMPLE 1

The following materials are mixed and stirred until homogeneous:

| Component | Amount (mg) |
| --- | --- |
| Polyvinylformal Formvar ®7/95E[1] | 100.0 |
| 2-Phenyl-1,3-dioxane | 55.0 |
| Polyacetal of formaldehyde and 1,5-pentanediol | 46.0 |
| 2-Tribromomethylquinoxaline | 21.0 |
| Triethylene glycol diacetate, 1% in tetrahydrofuran | 0.6 ml |

[1]Prepared from 95% hydrolyzed polyvinyl acetate, Monsanto

The mixture is coated with a 0.003 inch (0.76 mm) doctor knife on a polyethylene terephthalate film base, 0.001 inch (0.025 mm) thick and is air dried. The film is exposed for two minutes through a target with a bank of black light blue fluorescent bulbs. It is then placed on a warm hotplate (~100° C.) and is toned by dusting on Du Pont 4C Cromalin ® red toner. A good image with low background stain is produced that is opposite (negative-working) to the original target.

EXAMPLES 2 TO 8

Photosensitive elements of the composition set forth in the following Table are prepared as described in Example 1 using tetrahydrofuran as the coating solvent. The compositions of Examples 2 and 3 contain 6 mg of triethylene glycol diacetate. The elements are exposed for two to six minutes as described in Example 1 and are toned as described in that Example. Reflection densities are determined by using a standard reflection densitomer. The image quality ratings set forth in the Table are as follows:

A—reflection density of image on white background is greater than 0.6,

B—reflection density of image on white background is less than 0.6 but greater than 0.4, C—reflection density of image on white background is less than 0.4.

TABLE

| Ex. | Binder (a) (mg) | Photosensitizer (b) (mg) | Polyacetal(c) (mg) | Acetal (d) | Image Quality |
| --- | --- | --- | --- | --- | --- |
| 2 | Described in Ex. 1, 100 | 2-tribromomethyl-quinoxaline, 30 | — | 2-phenyl-1,3-dioxane, 150 | A |
| 3 | Described in Ex. 1, 100 | Described in Ex. 2, 30 | Polyacetal of formaldehyde and 1,5-pentanediol, 60 | — | C |
| 4 | Polyvinylformal[2], 100 | Described in Ex. 2, 10 | Described in Ex. 3, 50 | Described in Ex. 2, 40 | A |
| 5 | Described in Ex. 4, 170 | Described in Ex. 2, 10 | Described in Ex. 3, 50 | Described in Ex. 2, 40 | B |
| 6 | Described in Ex. 4, 170 | Carbon tetrabromide, 5 | Described in Ex. 3, 50 | Described in Ex. 2, 40 | B |
| 7 | Described in Ex. 4, 170 | 2-Tribromomethyl-quinoline, 10 | Described in Ex. 3, 50 | Described in Ex. 2, 40 | C |
| 8 | Described in Ex. 1, 40 | N-chloro-2-aza cyclononanone, 10 | Described in Ex. 3, 10 | Described in Ex. 2, 20 | C |

[2]Prepared from 85% hydrolyzed polyvinyl acetate, Formvar ®12/85, Monsanto

EXAMPLE 9

The following materials are mixed and stirred until homogeneous:

| Component | Amount (mg) |
| --- | --- |
| Polyvinylformal described in Example 1 | 100.0 |
| Styrene/maleic anhydride copolymer (SMA 1000A) | 10.0 |
| 2-Phenyl-1,3-dioxane | 80.0 |
| Polyacetal of formaldehyde and 1,5-pentanediol | 50.0 |
| 2-Tribromomethylquinoxaline | 30.0 |
| Triethylene glycol diacetate, 3% in methylene chloride | 1.0 ml |

The mixture is coated with a 0.003 inch (0.76 mm) doctor knife on the silicone side of two 0.001 inch (0.025 mm) thick silicone release polyethylene terephthalate film base. One element is exposed through a target to a bank of black light blue fluorescent lights for six minutes, is warmed on a hotplate (~75° C.), and is dusted with a red Du Pont Cromalin ® toner, to give a red image, opposite (negative-working) to the original target. A second element in its unexposed state is laminated onto the exposed and toned first element by four passes of the two elements, in face-to-face contact, through a heated roller at about 113° C. After peeling the silicone release polyethylene terephthalate film base off the laminated second element, the two layer element is exposed as described above, but with the target rotated 90°. After warming on a hotplate (~50° C.) and dusting with a blue Du Pont Cromalin ® toner, the film exhibits two distinct blue and red images with no mixed toning of the imaged areas.

I claim:

1. A photosensitive element comprising a support bearing a layer of a negative-working tonable photoimaging composition which consists essentially of
   (a) at least one organic polymeric binder taken from the group consisting of polyvinylformal, polyvinylpyrrolidone, polyacrylate, cellulose acetate, polymethacrylate, and polyvinyl acetate;
   (b) a photosensitizer which upon absorption of actinic radiation is capable of generating an acid; and (c) at least one acetal compound of the formula

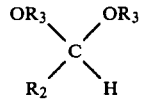

wherein $R_2$ is alkyl of 1 to 18 carbon atoms, furyl, substituted furyl, phenyl, substituted phenyl, naphthyl, and substituted naphthyl, $R_3$ is alkyl of 1 to 18 carbon atoms, and $OR_3$ when taken together form a 5, 6 or 7 membered ring,
   (d) a plasticizer in an amount of up to 20% by weight based on the total dry weight of the photoimaging composition; and
   (e) a polymeric anhydride in an amount up to 10% by weight based on the total weight of solids
the polymeric binder (a) being plasticized by the decomposition product of the acetal compound.

2. A photosensitive element according to claim 1 wherein the binder (a) is polyvinylformal.

3. A photosensitive element according to claim 1 wherein the photosensitizer (b) is 2-tribromomethylquinoxaline.

4. A photosensitive element according to claim 1 wherein the photosensitizer (b) is carbon tetrabromide.

5. A photosensitive element according to claim 1 wherein after imagewise exposure the element retainers toner particles in the exposed image areas.

6. A photosensitive element according to claim 5 wherein after imagewise exposure the element retains toner particles in the exposed image areas.

* * * * *

UNITED STATES PATENT OFFICE
CERTIFICATE OF CORRECTION

PATENT NO. : 4,356,252
DATED : October 26, 1982
INVENTOR(S) : Ross A. Lee

It is certified that error appears in the above-identified patent and that said Letters Patent are hereby corrected as shown below:

| Column | Line | |
|---|---|---|
| 8 | 19 | "retainers" should be --retains-- |
| 8 | 21 | "5" should be --2--. |

Signed and Sealed this

Thirty-first Day of May 1983

[SEAL]

Attest:

DONALD J. QUIGG

Attesting Officer    Acting Commissioner of Patents and Trademarks